United States Patent
Rijssemus

(10) Patent No.: US 7,965,153 B2
(45) Date of Patent: Jun. 21, 2011

(54) SIGNAL SPLITTER

(75) Inventor: Martien Rijssemus, Heelsun (NL)

(73) Assignee: Technetix Group Limited (GB)

(*) Notice: Subject to any disclaimer, the term of this patent is extended or adjusted under 35 U.S.C. 154(b) by 0 days.

(21) Appl. No.: 12/780,105

(22) Filed: May 14, 2010

(65) Prior Publication Data
US 2010/0225412 A1 Sep. 9, 2010

Related U.S. Application Data

(63) Continuation of application No. 11/204,608, filed on Aug. 16, 2005, now Pat. No. 7,746,194.

(30) Foreign Application Priority Data

Aug. 12, 2005 (GB) .................................. 0516561.8

(51) Int. Cl.
*H01P 5/12* (2006.01)
(52) U.S. Cl. .......... 333/124; 333/126; 333/129; 333/132
(58) Field of Classification Search .................. 333/124, 333/129, 132, 134
See application file for complete search history.

(56) References Cited

U.S. PATENT DOCUMENTS

| | | | | | |
|---|---|---|---|---|---|
| 5,006,822 | A | * | 4/1991 | Reddy | 333/112 |
| 5,126,704 | A | * | 6/1992 | Dittmer et al. | 333/125 |
| 5,347,245 | A | * | 9/1994 | Wright, Jr. | 333/131 |
| 6,118,354 | A | * | 9/2000 | Decramer et al. | 333/131 |
| 6,542,047 | B2 | * | 4/2003 | Chen et al. | 333/119 |
| 6,806,790 | B2 | * | 10/2004 | Ji | 333/119 |
| 6,965,280 | B2 | * | 11/2005 | Chen | 333/131 |

* cited by examiner

*Primary Examiner* — Robert Pascal
*Assistant Examiner* — Kimberly E Glenn
(74) *Attorney, Agent, or Firm* — Barnes & Thornburg LLP

(57) ABSTRACT

A signal splitter comprising an input and a plurality of outputs is provided, wherein alternate outputs are connected to phase shifting devices. The phase shifting devices preferably comprise phase shifting transformers and introduce a phase shift of 180°, so that noise components of alternate outputs are antiphase and cancel one another out almost entirely when the signals are summed. Also provided is a cable television network comprising a plurality of such signal splitters to ensure that noise ingress in upstream signals passing into the network is substantially reduced.

12 Claims, 2 Drawing Sheets

SIGNAL SPLITTER

RELATED APPLICATIONS

This application is a continuation of U.S. patent application Ser. No. 11/204,608, filed Aug. 16, 2005, now U.S. Pat. No. 7,746,194.

FIELD OF THE INVENTION

This invention relates to a signal splitter for reducing noise ingress and a cable television network incorporating such splitters.

BACKGROUND TO THE INVENTION

Cable television networks are no longer purely distribution networks used for TV and radio distribution, but now also provide access for the customer to the networks. Thus TV and radio signals are distributed from a local centre or optical node by way of a signal splitter with an output connected to each customer. Return traffic from each customer is returned through the splitter to the local centre or optical node and thence to the rest of the network. Such return traffic might include requests for pay-per-view television programmes.

Usually the traffic from the customer to the local centre or optical node is called "return path traffic" or "upstream signals". The upstream signals are transported using a different frequency range than the distribution signals (usually called "downstream signals") originating from the network provider. Modern cable TV networks typically use 5 MHz to 65 MHz for upstream signals and 85 MHz to 862 MHz for downstream signals, although other frequency ranges are also used.

All upstream signals, no matter how they originate, are transported to the local centre or optical node. Thus unwanted noise in upstream signals will also be injected into the network. The unwanted signals originate from various sources but a major part is due to radiation of outside transmitters in the used upstream frequency range. The total sum of these unwanted signals is known as "ingress". The majority of ingress originates from the in-house installation of the customer and is therefore injected into the network at a customer access point. This ingress is a major problem in the network since all these unwanted signals are summed and will limit the signal to noise ratio (and therefore the capacity) of the upstream signals.

It is an aim of the present invention to provide a signal splitter which reduces noise ingress into a cable television distribution network.

SUMMARY OF THE INVENTION

In accordance with the present invention, there is provided a signal splitter comprising an input and a plurality of outputs, wherein alternate outputs are connected to phase shifting devices. Where such a signal splitter is used in a cable television network, the phase shifting devices ensure that noise ingress in upstream signals, i.e. those originating from the customer, passing into the network is substantially reduced. The upstream signals are made up of signals from a number of different customers, each customer signal including data and noise components. The data components from different customers are unrelated in amplitude, phase, and frequency as they originate from different subscriber equipment. However the noise components in each customer signal are similar to one another because they originate for the most part from the same source, namely radio frequency electromagnetic radiation picked up by the equipment of the subscribers and the cables connecting such equipment to the outputs of the splitter. Introduction of a phase shift into the upstream signal before it reaches an output ensures that the noise components cancel one another when the upstream signals originating from the customers are summed by the splitter.

Preferably the phase shifting devices introduce a phase shift of 180°, so that noise components of alternate outputs are antiphase and cancel one another out almost entirely when the signals are summed.

Each phase shifting device may comprise a phase shifting transformer.

Where the splitter has an even number N of outputs, N/2 phase shifting devices will be required, N/2 being a whole number. Where the splitter has an odd number X of outputs, then the number of phase shifting devices used will be the nearest whole number above or below X/2.

If required the phase shifting devices may be permanently connected to their respective outputs and secured within a common housing to the outputs, so being built into the splitter. Alternatively the phase shifting devices may be separable from their respective outputs.

In accordance with another aspect of the invention, there is provided a cable television network incorporating a plurality of signal splitters comprising an input and a plurality of outputs, wherein alternate outputs are connected to phase shifting devices, the phase shifting devices acting in use to ensure that noise ingress in upstream signals, i.e. those originating from the customer, passing into the network is substantially reduced.

BRIEF DESCRIPTION OF THE DRAWING FIGURES

The invention will now be described by way illustrative example and with reference to the attached drawing figures, in which.

DESCRIPTION

Figure 1:
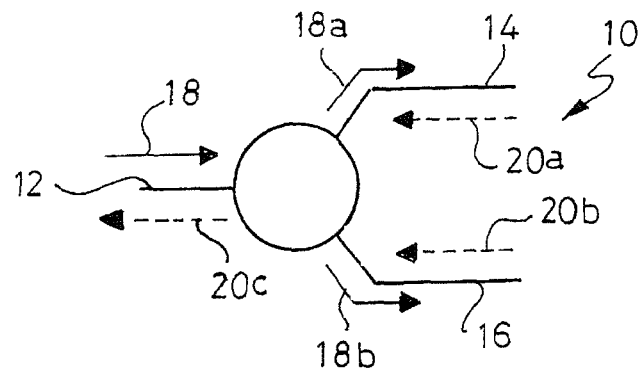
FIGS. 1 and 2 are schematic diagrams of prior art signal splitters.
Figure 2:
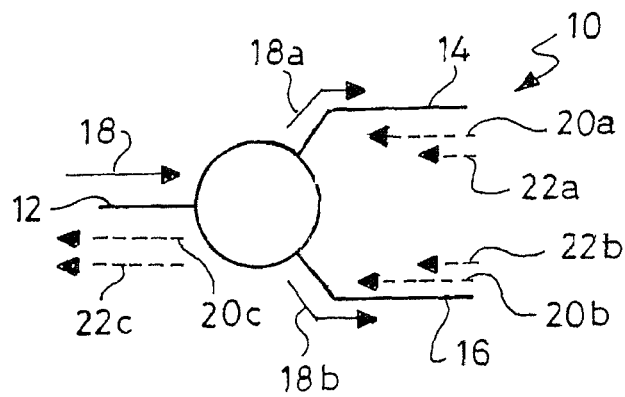

The prior art signal splitter 10 of FIGS. 1 and 2 comprises an input 12 and a large number of outputs, of which only a first output 14 and a second output 16 are shown for the purpose of clarity. In use these passive signal dividers 10 act as an interface between a local centre or node and a number of customers, each customer connected to one output of the splitter 10, with the splitter input 12 connected to the node. Arrow 18 represents transmission of television signals (downstream signals) from the service provider to the input of the splitter where the signal is divided or split for onward transmission to the customer, arrows 18a and 18b representing transmission of split television signals from the first and second outputs 14, 16 of the splitter 10.

Dotted arrows 20a and 20b represent the return transmission of data signals (upstream signals) from the first and second subscribers to the first and second outputs of the splitter.

The splitter sums the data signals from all subscribers to which it is connected and applies them to the input of the splitter. Dotted arrow 20c represents transmission of all summed data signals from the input of the splitter to the service provider.

Turning to FIG. 2, short dotted arrows 22a and 22b represent noise components present in the data signals transmitted from the subscribers to the first and second inputs of the splitter. The splitter 10 not only sums the wanted data signal but also sums the noise components and applies them to the input 12 of the splitter. Long dotted arrow 22c represents transmission of the summed noise signals from the input of the splitter to the service provider.

With a large number of outputs, the summed noise components applied to the input of the splitter (and hence transmitted from the input of the splitter to the service provider) become significant in comparison with the data signals, thus reducing the signal transmission capacity of the upstream channel between the splitter and the service provider. By way of example, suppose there are 1000 customers connected to a single local centre or optical node. If all customers produce the same amount of ingress then the total signal to noise ratio at the local centre or optical point will degrade with a factor 1000 or 30 dB.

Figure 3:
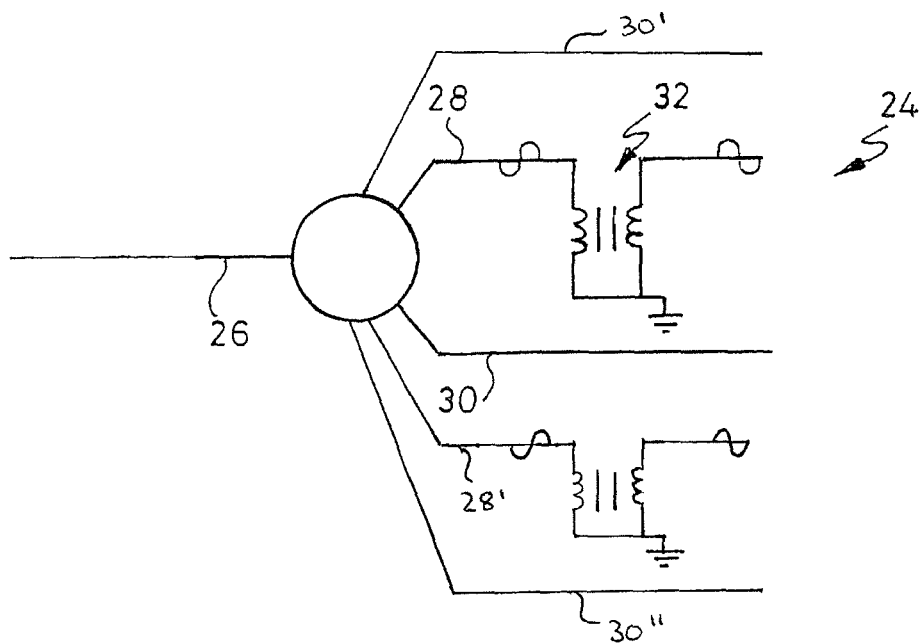
FIG. 3 is a schematic diagram of a signal splitter in accordance with the invention.

A splitter 24 in accordance with the present invention is shown in FIG. 3 and comprises an input 26, a plurality of outputs of which only five outputs 30', 28, 30, 28' and 30" are shown for clarity, and a plurality of phase shift transformers connected to alternate outputs, of which only transformers 32 and 32' connected to output 28 and output 28' are shown. The outputs thus form first and second groups, the first group of outputs not connected to a transformer, the second group connected to a transformer. Each transformer is only connected to one output. The phase shift transformers can be built into the splitter and permanently associated with their respective outputs. Alternatively the transformers can be connected externally to existing outputs.

The phase shift transformers 32, 32' introduce a 180° phase shift into signals that pass through them. Thus split television signals applied to the second group of outputs 28, 28' are shifted in phase by 180° before being transmitted to the subscriber, and data signals transmitted by a subscriber's equipment connected to the first output 28 are shifted in phase by 180° before being applied to the outputs 28, 28'.

As explained above, the data signals transmitted by the subscribers to the outputs of the splitter include noise components. The noise components have various sources, the most significant of which is radio frequency electromagnetic radiation, which can be picked up by the subscribers' equipment and the cables connecting the outputs of the splitter to the equipment of the subscribers. In most cases, a source of radio frequency electromagnetic radiation that is picked up by one such cable or subscriber's equipment will be picked up by a large number of other such cables or subscribers' equipment.

The signal characteristics of the noise components will be very similar because they arise for the most part from the same source. The noise components will have much the same frequency, amplitude and phase. The phase shift transformers connected to alternate outputs of the splitter give rise to two groups of noise components. The noise components of both groups have much the same frequency and amplitude, but the noise components of the first group are in antiphase with the noise components of the second group. When the noise components of both groups are summed, they cancel each other out so that the noise components of the summed signals applied to the input of the splitter are much reduced.

The wanted data signals originating from the customer are unaffected as the data components from different customers are unrelated in amplitude, phase, and frequency as they originate from different subscriber equipment. They are therefore not reduced by summation after phase shifting. The downstream signal is also not affected by the phase shift, and thus by using a phase shifting transformer mounted between the splitter output and the connected branch of the network, wanted downstream and upstream signals are unaffected whilst ingress is attenuated.

Of course, there are some localised sources of radio frequency electromagnetic radiation that are picked up by only one subscriber's equipment or one cable, such as an electric motor in an appliance in a house of a subscriber. The introduction of the phase shift cannot reduce such a noise component.

Many houses have connections to two outputs of the splitter, one connection being used for cable television and the other for telephone or internet service. Provided that one connection is to an output of the splitter with a phase shift transformer and the other connection is to an output without such a transformer, noise components due to even a localised source of radio frequency electromagnetic radiation can be reduced.

Figure 4:
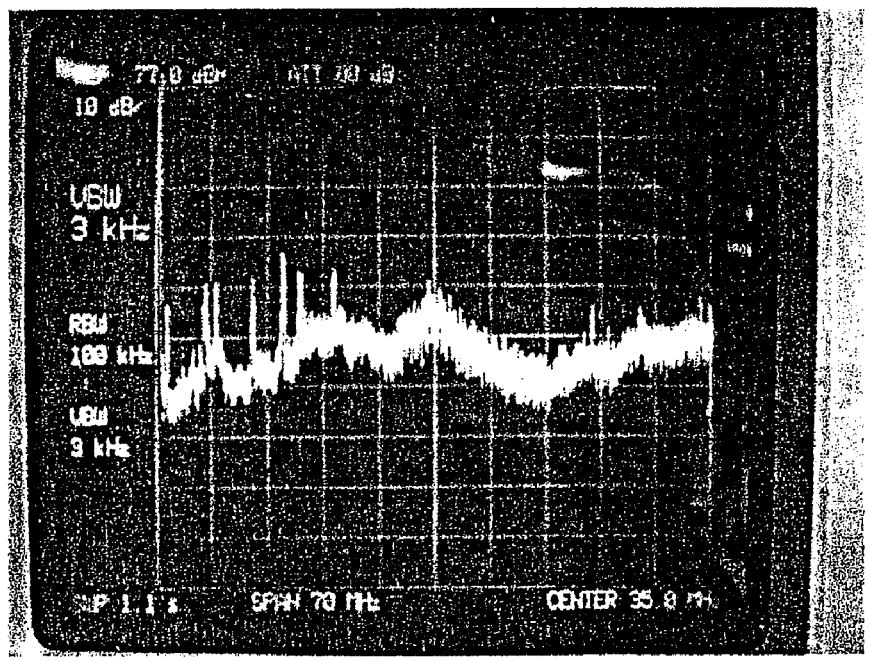
FIGS. 4 and 5 are spectrum analyser traces showing the powers of the summed signals at the inputs, respectively, of a prior art signal splitter and a signal splitter according to the invention, when used in a cable television network.

FIG. 4 shows the signal power at the input 12 of the prior art splitter 10 when used in a cable television network. The range of frequencies shown in the spectrum analyser trace is 0 to 70 MHz, which encompasses the frequency range used for the signal return path.

A peak of between 50 dB and 60 dB can be seen near to the middle of the trace i.e. at around 35 MHz. This is due to the summed noise components of the data signals transmitted to the splitter by the subscribers.

Figure 5:
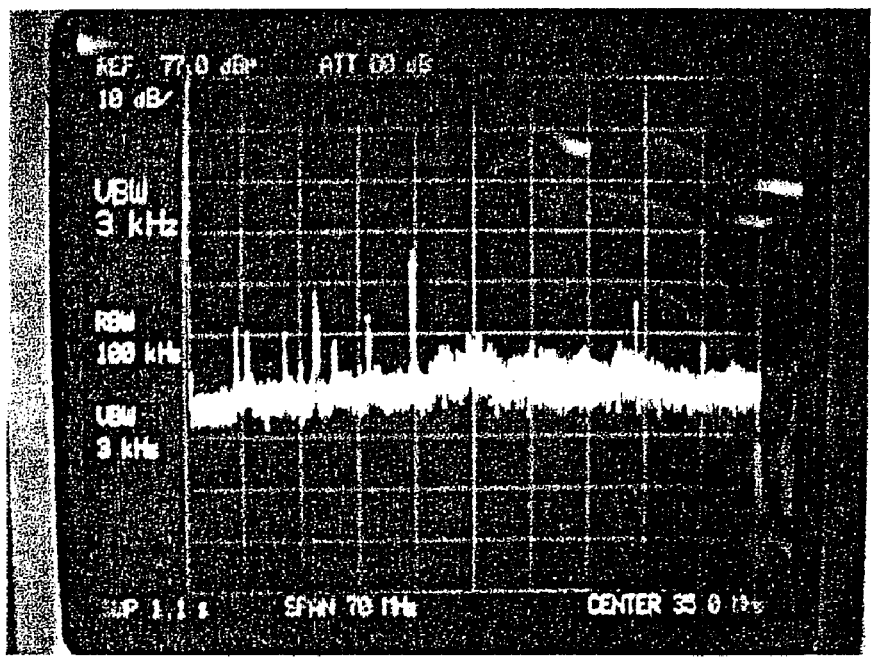

FIG. 5 shows the signal power at the input 26 of the splitter 24 of the invention when used in the same network. The signal power at around 35 MHz can be seen to be between 40 dB and 50 dB. The decrease of approximately 10 dB in the signal power at 35 MHz is due to the removal of 10 dB of the noise components by the splitter. In theory at least, this would result in an increase in the data transmission capacity of the channel between the input 26 and the service provider by a factor of 10.

The signal splitter of the invention is dependent for successful operation on similarity between the noise components of data signals applied to the outputs of the splitter. The reduction of the noise components in the summed data signals will be less pronounced if the noise components are of different amplitudes or experience different phase shifts during transmission from the subscribers' equipment to the outputs of the splitter. Nevertheless, a reduction of only 3 dB of the noise components can give rise to a doubling of the data transmission capacity of the upstream signal channel.

The reduction of the noise components is slightly less pronounced if the splitter has an odd number of outputs. In this case the number of phase shifters attached to the outputs should be as close as possible to half the number of outputs, for example two or three phase shifters for a splitter with five outputs. Of course, for a splitter with a larger odd number of outputs, the effect of having phase shifters attached to slightly less or more than half the outputs of the splitter decreases with increasing numbers of outputs.

What is claimed is:

1. A bi-directional signal splitter for use in a cable television network, the splitter comprising an input and at least three outputs and being operable to split signals at the input for downstream transmission from the outputs and to sum signals at the outputs for upstream transmission from the input, wherein the at least three outputs are made up of first and second groups of outputs and the splitter is operable to introduce a phase shift of approximately 180° into the signal at each of the second group of outputs before summing the signals for upstream transmission from the input.

2. A bi-directional signal splitter according to claim 1, wherein the splitter comprises at least one transformer.

3. A bi-directional signal splitter according to claim 1, wherein the splitter is operable in a frequency range of 5 MHz to 862 MHz.

4. A cable television network incorporating a plurality of bi-directional signal splitters according to claim 1.

5. A bi-directional signal splitter for use in a cable television network, the splitter comprising an input and a plurality of outputs and being operable to split signals at the input for downstream transmission from the outputs and to sum signals at the outputs for upstream transmission from the input, wherein each of the plurality of outputs is connectable to a different item of subscriber equipment and the outputs are connected to phase shifting devices to introduce a phase shift of approximately 180° between adjacent outputs so as to reduce noise within signals summed for upstream transmission.

6. A bi-directional signal splitter according to claim 5 operable in a frequency range of 5 MHz to 862 MHz.

7. A bi-directional signal splitter according to claim 6, wherein the phase shifting devices are phase shifting transformers.

8. A cable television network incorporating a plurality of bi-directional signal splitters according to claim 5.

9. A bi-directional signal splitter for use in a cable television network, the splitter comprising an input and a plurality of outputs comprising a first group of outputs and a second group of outputs and being operable to split signals at the input for downstream transmission from the outputs and to sum signals at the outputs for upstream transmission from the input, wherein the outputs are associated with phase shifting devices, the phase shifting devices shifting the phase of noise components associated with said first group of outputs so as to be substantially in anti-phase with noise components associated with said second group of outputs, such that when the noise components of said first and second groups are summed for upstream transmission, noise within the summed signal applied to the input is much reduced.

10. A bi-directional signal splitter according to claim 9 operable in a frequency range of 5 MHz to 862 MHz.

11. A bi-directional signal splitter according to claim 10, wherein each phase shifting device comprises a phase shifting transformer.

12. A cable television network incorporating a plurality of bi-directional signal splitters according to claim 9.

\* \* \* \* \*